United States Patent [19]

Kuehnle

[11] 4,049,963
[45] Sept. 20, 1977

[54] PHOTOELECTRIC MEASURING DEVICE

[75] Inventor: Manfred R. Kuehnle, Lexington, Mass.

[73] Assignee: Coulter Information Systems, Inc., Bedford, Mass.

[21] Appl. No.: 717,169

[22] Filed: Aug. 24, 1976

Related U.S. Application Data

[63] Continuation of Ser. No. 397,308, Sept. 14, 1973.

[51] Int. Cl.² .............................................. H01J 39/12
[52] U.S. Cl. ................................. 250/211 R; 357/30
[58] Field of Search ................. 250/211 R, 211 J, 201, 250/212; 357/30, 31; 354/22, 23

[56] References Cited

U.S. PATENT DOCUMENTS

| | | | |
|---|---|---|---|
| 3,556,787 | 1/1971 | Letter | 357/30 |
| 3,693,013 | 9/1972 | Dueker | 357/30 |
| 3,739,174 | 6/1973 | Gloge | 250/201 |

Primary Examiner—David C. Nelms
Attorney, Agent, or Firm—Silverman & Cass, Ltd.

[57] ABSTRACT

A transparent photocell formed of two thin film layers of a semi-conductor material and an intervening thin film layer of a photoconductor material, a constant voltage being applied across the semi-conductor layers and the current through the cell being detected as a measure of the intensity of light incident on the cell. The thin film nature of the cell enables it to be combined with a lens of an optical system as a plurality of laminae coated onto a surface of said lens.

5 Claims, 2 Drawing Figures

PHOTOELECTRIC MEASURING DEVICE

This is a Continuation, of application Ser. No. 397,308 Filed Sept. 14, 1973.

CROSS REFERENCE TO RELATED APPLICATION

Reference is made to copending application Ser. No. 378,180 filed July 11, 1973 by Manfred R. Kuehnle entitled "Electrophotographic Film and Method of Making and Using the Same", now abandoned and owned by the assignee of this application.

FIELD OF THE INVENTION

This invention relates generally to radiation measuring apparatus and more particularly provides an optically transparent photocell formed of thin film layers of inorganic materials.

BACKGROUND OF THE INVENTION

Photocells for use in light measuring devices such as those utilized in the photographic and optical fields employ either photovoltaic or photoresistive elements which are responsive to incident light either by producing a voltage potential or by changing their resistance, respectively. Generally the output signals of such elements vary as the intensity of the incident light in accordance with some function which is utilized either to drive a meter or perform some function. So far as known, prior photocells include opaque elements in the assemblies of their components. Such assemblies block part of the optical path which they intercept and hence are normally offset from the optical systems they control or are arranged to monitor. Alternately they are inserted into the optical path and swung out of such path when the optical system is to be utilized.

A photocell which is permanently arranged offset from an optical system must be small so as not to occupy too much space and additionally cannot give an absolutely true reading of the light passing into the optical system along its axis. A structure which must move into and out of the path of the optical system is complex and expensive.

Known photo cells are structures independent of optical systems and must be constructed, handled and assembled as another component of the system.

There has been a need for a photocell which will not substantially absorb the light which is incident thereon. Such a photocell would have to be sensitive and accurate. It could advantageously be incorporated directly into an optical system with accompanying saving in space and elimination of structural components.

The expression "thin film" as used herein means a layer or coating not than a few thousands of Angstroms. Actually, the invention is concerned with thin layers of the order of substantially less then 1000 A.

SUMMARY OF THE INVENTION

A transparent photocell is formed of a pair of thin film layers of electrically conductive material and an intervening thin film layer of photoconductive material, the layers being intimately bonded to one another and one of the electrically conductive layers being intimately bonded to a substrate. Means are provided to establish a potential across the electrically conductive layers. Currnet flow between the electrically conductive layers is detected as a measure of the radiation passing through said photocell. The photocell operates as a photo-responsive diode. The photocell is capable of being coated onto a lens of an optical system, and will absorb only a negligible amount of the light passing through such system.

DESCRIPTION OF THE PREFERRED EMBODIMENTS

The photocell according to the invention is optically transparent and comprises two thin film layers of an inorganic conductive material sandwiching between them a third thin film layer of an inorganic photoconductor. One of the sandwiching layers of conductive material may be bonded to a substrate such as plastic sheeting of high stability or to the surface of a lens of an optical system. The two thin film layers of conductive material are connected to a d.c. source of constant voltage. The photoconductor layer functions as a variable resistor or diode to regulate the direct current that results when the photocell is subjected to light or other radiation to which the photocell may be responsive. Current is monitored and the amount is generally a measure of the light intensity. Only a small percentage of the intercepted light is lost due to absorption, with the majority of the light flux passing entirely through the photocell.

Figure 1:
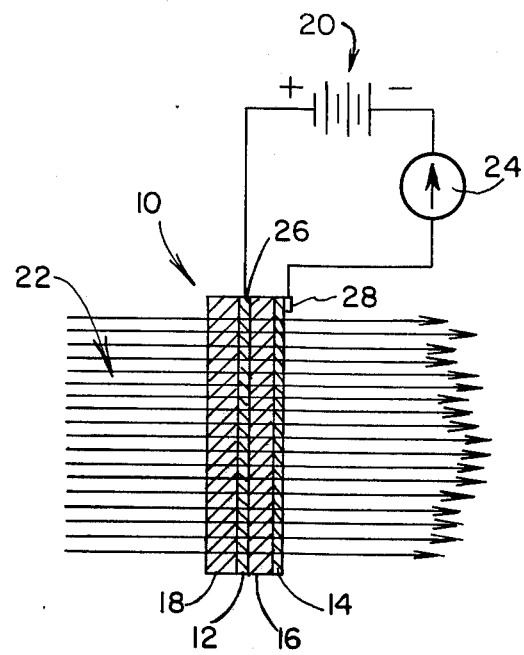
FIG. 1 is a highly schematic sectional view of a transparent photocell constructed in accordance with the invention and illustrating diagrammatically a circuit for measuring the intensity of light along an optical path intercepted by said photocell.

The three important elements of the photocell according to the invention are shematically illustrated in FIG. 1 wherein the photocell is designated generally by reference character 10. The photocell 10 comprises a pair of thin film layers 12 and 14 of conductive material applied to a substrate 18. An intervening thin film layer 16 of photoconductive material is sandwiched between said conductive layers 12 and 14. A constant voltage is applied across said conductive layers 12 and 14 from a d.c. source of constant voltage represented by reference character 20.

The photocell 10 is placed in intercepting relation to a field 22 of light. Light incident upon the photocell 10 is transmitted through the first thin film layer 12 of conductive material and enters the photoconductive layer 16. A unidirectional current is thus caused to flow between the layers 12 and 14 and generally is proportional to the intensity of the light because the sandwiched layer 16 exhibits a resistance to electric current which decreases with greater light intensity. Current responsive means such as microammeter 24 are provided to detect and measure current flow and provide a response directly related to the intensity of the light. The response may comprise the movement of a needle over a dial or the like.

The thickness of the conductive layers 12 and 14 respectively is in the range of about 50 A. The thickness of the photoconductive layer 16 lies in the range of about 300 A to 500 A. The constant voltage for a typical cell is of the order of volts d.c.

As shown in FIG. 1, contact is made at 26 and 28 with the thin film conductor layers 12 and 14 in any conventional manner. Thin metal contact strip such as 28 may be utilized.

The three layers 12, 14 and 16 of the photocell 10 preferably are laid down by so-called sputtering techniques disclosed in the copending application. The substrate 18 is passed through a first pressure chamber and the conductor layer 12 deposited on one surface. In like manner, the photoconductive layer 16 is applied over the conductor layer 12. Thereafter, the second conductor layer 14 is applied over the photoconductor layer 16, the contact strip 26 being applied by suitable deposition technique at the suitable contact area or by masking. In the case of the contact 26 for the first conductor layer 12, such contact may be applied prior to deposition of said layer 12 on the substrate 18.

The contact 28 for layer 14 may be applied prior to the application of layer 14 to layer 16 or subsequent to such application.

Since the conductive layers 12 and 14 have a constant voltage potential applied between them, layer 14 promotes the migration of electrons from the photoconductive layer when the latter absorbs photons from the incident light. Both conductive layers 12 and 14 are substantially thinner than the photoconductor layer 16. The overall thickness of the sandwich is such as not to interfere substantially with the optical transparency of the photocell. Typically the cell can be constructed to absorb not more than 5% to 10% of the incident light. Effectively, a capacitive circuit is defined by said conductor layers 12 and 14, the incident light entering the photoconductive layer causing electrons therein to migrate to the layer 14. This migration appears as current flow between said layers 12 and 14 and can be monitored, detected and measured by suitable means 24 such as a microammeter.

A purity grade of semiconductor indium oxide is a suitable material for use as the conductive layers 12 and 14.

The photoconductor layer 16 is formed of a compound or alloy which has the necessary characteristics described herein. Preferably, Cadmium Sulfide (CdS) or Indium Zinc Sulfide ($I_2Zn\ S_4$) is used. Other materials which are believed capable of being used to form the layer 16 are Silicon Nitride ($Si_3N_4$), Zinc Sulfide (ZnS), Antimony Sulfide ($Sb_2S_3$), Arsenic Sulfide ($As_2S_3$), Gallium Arsenide (GaAs), Cadmium Selenide (GaSe), Zinc Selenide (ZnSe) and perhaps others. These materials may also be doped with various dopants such as copper (Cu), to vary their spectral response. The preferred form of layer 16 is n-type, as cadmium sulfide.

Layer 16, the photoconductor layer, is always an inorganic mircrocrystalline material having a thickness of the order of 300–500 Angstroms. Such layer may have a thickness up several thousand Angstroms but preferably is in the thinner range.

One characteristic of the photoconductive photoconductor layer 16 is its hardness which approaches that of glass. Abrasion resistance is important since it obviates scratches, scores and the like which could cause dispersion of the incident light. The ohmic layers are also quite hard and abrasion resistant when coated by sputtering and if the cell is formed as coatings on a lens of an optical system as described below, the protection from abrasion or the like eliminates the need for the presently utilized silicon monoxide coatings used on such lenses.

The photoconductive layer 16 has high photoelectric gain which increases the photosenitivity of the cell. The two materials mentioned above are cadmium sulfide and zinc indium sulfide. The former has a dark resistivity of $10^{12}$ ohm centimeters and a light resistivity of $10^8$ ohm centimeters. The latter has a dark resistivity of $10^{14}$ ohm centimeters and a light resistivity of $10^{10}$ ohm centimeters. The ratio between these values for the respective materials is thus of the order of $10^4$. Thus, instead of a single electron being moved when struck by a photon as many as a million such electrons will pass as current between the two conductive or ohmic layers. A discussion of the characteristics of the photoconductive layer 16 in some detail is contained in the copending application.

The copending application discloses an electrophotographic member which includes a substrate having a layer of ohmic material deposited thereon and a coating on top of the ohmic layer which is formed of the same substance as proposed herein-preferably cadmium sulfide. In the copending application it is explained that it has been discovered that the thinner the coating of the photoconductive material the higher the gain, and that there is a compromise between the desire to absorb light to a certain degree in order to achieve a distribution of charge in the member which is an image of the scene being viewed. The thicknesses of the ohmic and photoconductive layers are thus of the order of 500 A and 3500 A respectively in said copending application, but in the instant case since there is no need for retaining charge and no toning, the layers can be substantially thinner. The compromise to be made herein is to have the layer as thin as possible to intercept as little light as possible and have a high gain, but also to have enough light absorbed to produce a good signal.

In the invention, as pointed out above, the thickness of the conductive coatings is of the order of 50 A while that of the photoconductive coating is of the order of 300 A to 500 A which causes an absorbance of 5% to 10% of light compared to 15% to 30% for the laminae of the electrophotographic film of the copending application.

The substrate member 18 serves as the carrier of mechanical support for the photocell 10. The desirable properties are flexibility, strength, transparency, ability to adhere to the deposited layers and of great importance-stability. The stability refers to dimensional stability, stability in retaining thickness and stability in resisting any changes which may occur due to being subjected to the temperatures and electrical phenomena which occur within the pressure vessel during the depositing processes. Resistance to abrasion is a good property to include in choosing the substrate material.

Polyester sheeting of 0.005 thickness is one example of a substrate that has been satisfactory. This material is an organic polymer. Of excellent characteristics is such material made by the E. I. DuPont de Nemours Company and sold under the trademark "MYLAR". This material is sold with conditions of internal stress that are inherent due to its method of manufacture. Such stresses preferably are required to be removed prior to use, the process of doing so being referred to as normalization. This can be done by subjecting the film to 80 percent relative humidity at a temperature of about 100° Celsius for a period of about 30 minutes. Such steps are known.

The substrate material should not have any occluded gases, and these can be removed by outgassing the same in suitable chambers. Likewise, the sheeting should be perfectly clean and devoid of any static charge. Radioactive brushing is accomplished prior to deposition.

Figure 2:
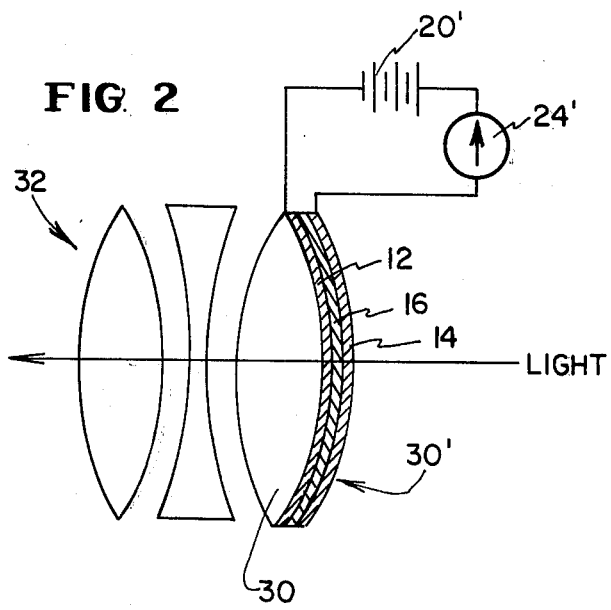
FIG. 2 is a view similar to that of FIG. 1 but illustrating the photocell of the invention applied directly to a lens of an optical system.

In FIG. 2, the photocell 30' identical to photocell 10 is deposited directly upon one face of lens 30 of an optical system 32, such deposition utilizing said one lens 30 as the equivalent of the substrate 18. This arrangement has several important advantages. The optical system represented by the diagram of FIG. 2 could be a camera or any optical measuring instrument or a system which functions in reponse to variations of light. The element 24' could be a meter or a signal device which responds to the value of current flowing in the circuit.

In the system of FIG. 2 the light which passes to the sensitive film, for example, of a camera is identical to the light which is incident upon the photocell so that an accurate and direct reading is obtained. Furthermore, since the cell 30' is so large and the gain of the photoconductive layer 16 is so high very low voltage is required to give a good strong signal. In cameras with built in photocells the cell is offset, it takes up unnecessary space and increases the cost of the apparatus because it is another component to handle, manufacture and install. The lens 30 with coatings provide a highly economical and effective adjunct to a camera or to any optical system in which information concerning the incident light is necessary.

The photocell of the invention is not subject to variations in response due to fatigue. The current drain is so low that the cell power supply may be connected at all times. The common cadmium sulfide cell as used in many cameras today has a continuous drain, even in darkness, and it is common to have a switch to turn the power off when the camera is not being used. The resistivity of the photoconductive coating is so high in darkness that there is no need for such a switch.

What it is desired to secure by Letters Patent of the United States is:

1. A photoelectric measuring device comprising
   a substrate of optical material,
   a first ohmic layer having a thickness of the order of 50 to 100 A deposited on one surface of said substrate,
   a sputter deposited coating on said first ohmic layer and having a thickness of the order of 300 to 3500 A consisting principally of a wholly inorganic, mircrocrystalline, photoconductive material deposited with a vertical orientation to its crystal arrangement relative to the surface upon which deposited, said coating being electrically anisotropic and having high photoelectric gain, a dark resistivity of at least $10^{12}$ ohm-centimeters and a ratio of dark to light resistivities of at least about $10^4$,
   a second ohmic layer on said photoconductive coating and having a thickness of the same order as said first ohmic layer deposited upon said photoconductive coating,
   said device including substrate, layers and coating having better than 90 percent transmission of radiation at least in the visible spectrum to a degree not materially affecting the integrity of transmission of said radiation through said device and means for detecting current flow between said ohmic layers as a direct quantitative measurement of the radiation passing through, and device.

2. The structure as claimed in claim 1 in which the ohmic layers are formed of primarily indium oxide and the photoconductive coating is formed of cadmium sulfide.

3. The structure as claimed in claim 1 in which the optical element is a lens and the coating and layers constituting said device are applied directly thereto, transmission of radiation therethrough being non-distorted.

4. The structure as claimed in claim 1 in which the photoconductive material is selected from the group consisting of cadmium sulfide and zinc indium sulfide.

5. The structure as claimed in claim 1 in which the coating is 1000 A thick.

* * * * *